(12) United States Patent
Groh et al.

(10) Patent No.: US 6,921,089 B2
(45) Date of Patent: Jul. 26, 2005

(54) BATTERY MODULE GASKET (75) Inventors: William S. Groh, Knoxville, TN (US); Christopher E. Mainini, Knoxville, TN (US)

(73) Assignee: Radio Systems Corporation, Knoxville, TX (US)

( * ) Notice: Subject to any disclaimer, the term of this patent is extended or adjusted under 35 U.S.C. 154(b) by 0 days.

(21) Appl. No.: 10/704,004

(22) Filed: Nov. 7, 2003

(65) Prior Publication Data

US 2004/0100039 A1 May 27, 2004

Related U.S. Application Data (63) Continuation of application No. 09/994,113, filed on Nov. 26, 2001, now abandoned.

(51) Int. Cl.$^7$ ............................. F16J 15/02; B65D 53/00
(52) U.S. Cl. ..................... 277/628; 277/630; 277/644; 277/921; 220/803; 220/378
(58) Field of Search ................................. 277/628, 644, 277/630, 637, 647, 648, 921, 922, 910; 220/803, 804, 806, 378, 612, 614; 215/341–346, 355; 285/374, 901, 110; 174/655

(56) References Cited

U.S. PATENT DOCUMENTS

| | | | |
|---|---|---|---|
| 3,064,853 A * | 11/1962 | Lents et al. | 220/804 |
| 3,127,049 A * | 3/1964 | Welty et al. | 220/301 |
| 3,785,874 A * | 1/1974 | Schenk et al. | 429/174 |
| 3,900,130 A * | 8/1975 | Andrews | 220/378 |
| 3,912,110 A * | 10/1975 | Hammes | 220/610 |
| 4,209,102 A * | 6/1980 | Dunn et al. | 215/329 |
| 4,551,311 A * | 11/1985 | Lorenz | 422/300 |
| 5,074,428 A * | 12/1991 | Wildfeuer | 220/322 |
| 5,267,667 A * | 12/1993 | Cozzani | 220/787 |
| 5,568,876 A * | 10/1996 | Schutz | 220/254.8 |
| 5,641,085 A * | 6/1997 | Lonbardo | 220/203.12 |
| 5,750,022 A * | 5/1998 | Blake et al. | 210/169 |
| 5,868,273 A * | 2/1999 | Daenen et al. | 220/795 |
| 5,967,363 A * | 10/1999 | Allen | 220/806 |
| 6,202,887 B1 * | 3/2001 | Petit | 220/849 |
| 6,364,152 B1 * | 4/2002 | Poslinski et al. | 220/788 |
| 6,401,957 B1 * | 6/2002 | Przytulla | 220/319 |

* cited by examiner

Primary Examiner—Chuck Y. Mah
Assistant Examiner—Michael J Kyle
(74) Attorney, Agent, or Firm—Pitts & Brittian, P.C.

(57) ABSTRACT

A gasket sealing system for providing a gasket seal disposed between a lid removably connectable at a receiving module containing electrical circuitry and/or batteries. The lid includes a perimeter surface that is removably insertable against a rim bordering an opening into the module. A gasket is adapted to bond to the perimeter surface of the lid. The gasket includes a first contacting surface having an arcuate shape that deforms upon contact against the module rim. The gasket includes a bonding surface adapted to bond to the shape of the perimeter surface of the lid. The gasket is composed of a resilient material that is self-lubricating. When the lid is removed from the rim of the opening, the deformable gasket is disconnected from sealing against the rim of the module without disruption of the integrity of the gasket.

8 Claims, 5 Drawing Sheets

BATTERY MODULE GASKET

CROSS-REFERENCE TO RELATED APPLICATIONS

This is a continuation of application Ser. No. 09/994,113, filed Nov. 26, 2001, now abandoned.

STATEMENT REGARDING FEDERALLY SPONSORED RESEARCH OR DEVELOPMENT

Not Applicable.

BACKGROUND OF INVENTION

1. Field of Invention

This invention relates to an improved gasket for maintenance of a water resistant seal. More specifically, this invention relates to an improved gasket bonded on a surface connecting a lid to a housing.

2. Description of the Related Art

Prior devices have included gaskets that are composed of synthetic rubber or polyvinyl materials. The prior gaskets include "O" ring gaskets that are positioned to removably attach to a sealing lid utilized to provide a water resistant seal between the lid and a module or housing onto which the lid is attached.

The prior devices have required that the "O" ring gaskets be separated from the lid when the lid is removed for lubrication of the gasket, or for cleaning or replacement of electrical circuitry and/or batteries within the module or housing. Upon reinsertion of the prior "O" ring gaskets against the lid, the design of a prior gasket led to improper sealing of the lid when threaded onto the module or housing, and/or tearing of the gasket with resulting loss of the water resistant seal. Further, when a prior gasket was compressed for an extended time without periodic lubrication of the gasket, the prior "O" ring gasket failed due to drying of the gasket and sealing between the gasket, lid, and the module or housing surface, with resulting tearing of the gasket upon removal of the lid from the module or housing surface.

An improved gasket is needed to provide a resilient gasket which maintains unity with a lid to provide a seal between the surfaces of a lid and a receiving module, despite repetitive removal and reinsertion of the lid against the receiving module surface with the gasket positioned therebetween.

BRIEF SUMMARY OF INVENTION

In accordance with the present invention, there is provided an improved gasket sealing system including a gasket that is bonded to a perimeter portion of a first surface of a lid. The lid is removably attachable to a rim bordering an opening in a receiving module containing equipment requiring protection from moisture. The gasket includes a configuration that is bonded to a perimeter surface of the lid. The gasket includes a first surface that is deformable upon contacting against a surface of a receiving module while being adapted to match the shape of a perimeter surface of a lid. The gasket is composed of resilient material that is self-lubricating such as a thermoplastic elastomer material, a rubber material, or a similarly resilient material. When the lid is removably positioned against the receiving module, the gasket is deformed and maintained between the perimeter surface of the lid and the interior surface of the receiving module to form a seal that is substantially resistant to moisture and resistant to tearing. An interior portion of the gasket contains lubricant material that diffuses through exterior surfaces of the gasket to self-lubricate the gasket surfaces to maintain the resiliency of the gasket during extended periods of contact of the lid against the receiving module. An alternative embodiment of the gasket includes an outwardly tapered portion adjacent the first surface, with the outwardly tapered portion adapted to contact against an interior side surface of the receiving module opening when the lid is attached to the receiving module.

DETAILED DESCRIPTION OF THE INVENTION

Figure 1:
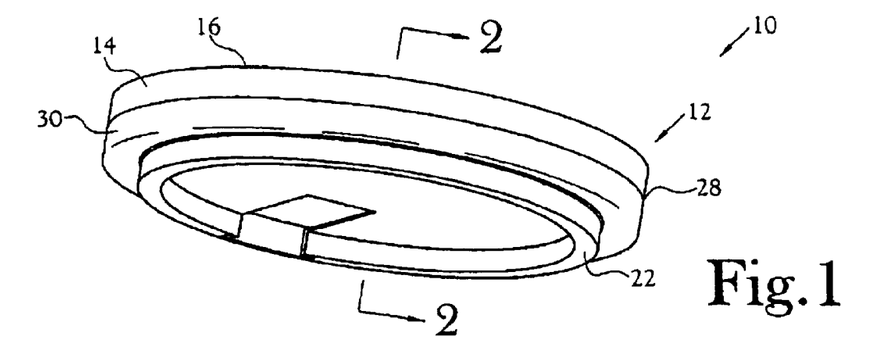
FIG. 1 is a perspective bottom view of an embodiment of a receiving module illustrating a gasket disposed on a lid in accordance with the present invention.
Figure 2:
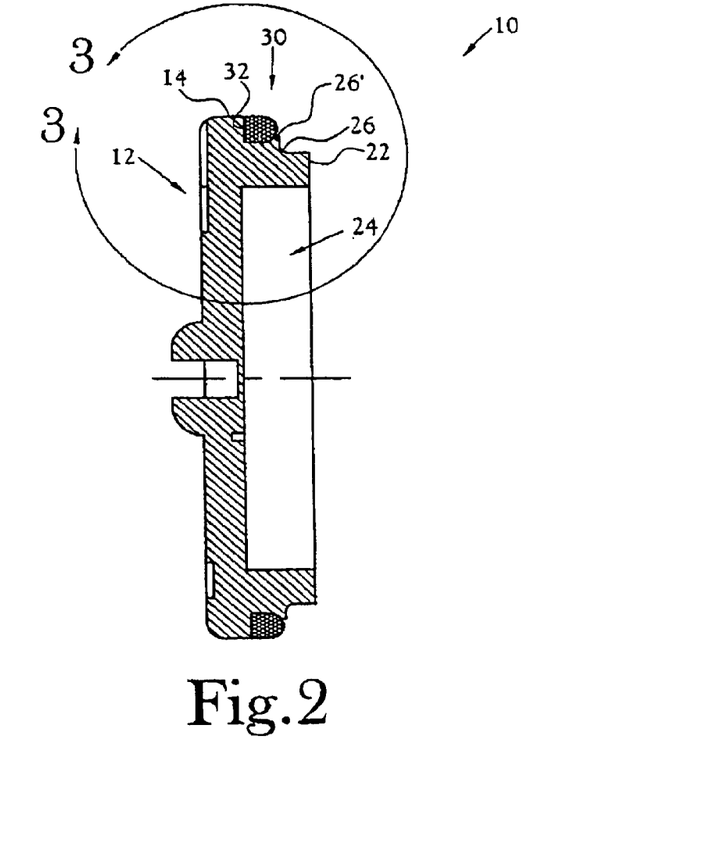
FIG. 2 is a side view, in section taken along lines 2—2 of FIG. 1, illustrating a gasket disposed on a perimeter surface of the lid.

In accordance with the present invention, there is provided an improved gasket sealing system 10 including a gasket 30 that is bonded on a perimeter surface of a lid 12. As illustrated in FIGS. 1 and 2, the lid 12 includes a perimeter edge 14, a top surface 16, and a first surface 22 forming a ridge with an opening 24 therein having a shallow depth. An interior recessed perimeter surface of the lid 12 includes a first circumferential bonding surface 28 (see FIGS. 1 and 4) disposed adjacent to a circumferential perimeter surface 26 having a perimeter side wall 26' extended substantially perpendicular from the first circumferential bonding surface 28 to the circumferential perimeter surface 26 of the lid 12 (see FIGS. 2 and 4). The interior recessed perimeter surface of the lid 12 is configured to form an outer circumferential ledge, also referenced as outer circumferential groove 28', in which the casket 30 is positioned against the bonding surface 28 and adjacent of the perimeter side wall 26'. Any alternative embodiment of the gasket 30 of the present invention may be bonded along the first circumferential bonding surface 28 of the lid 12 (see FIGS. 1, 2, 3a, 3b, 3c, 3d, and 4).

Figure 3A:
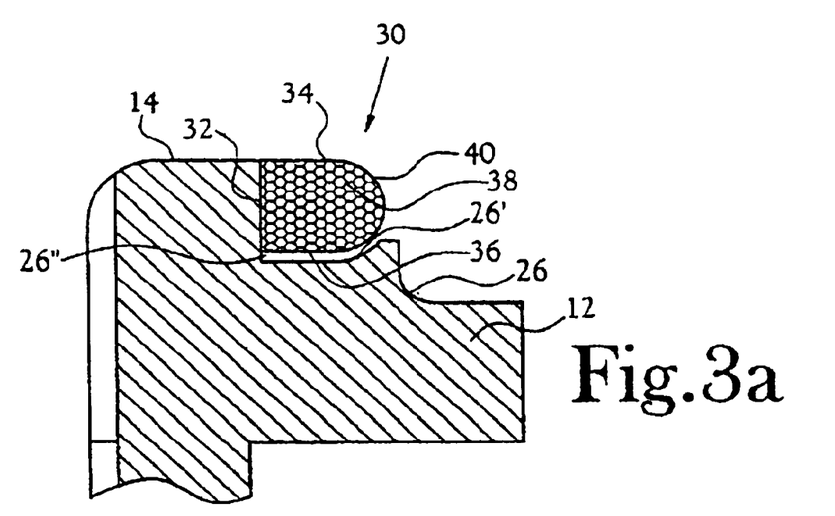
FIG. 3a is an exploded side view, in section taken along 3—3 of FIG. 2, illustrating one embodiment of the gasket positioned on the lid.

As illustrated in FIGS. 2 and 3a, one embodiment of the gasket 30 includes a pliable shape that is adapted to match a perimeter portion of the lid 12. The gasket 30 may be annular, circular, rectangular, or other configuration to match the perimeter of the lid 12. The gasket 30 includes a first, exterior faced contacting surface 40 positioned proximal and adjacent to a circumferential perimeter surface 26 of the lid 12. A first bonding surface 32 of the gasket 30 is substantially planar to allow bonding of the first bonding surface 32 against the first circumferential bonding surface 28 of the lid 12 (see FIG. 4). The gasket 30 includes an exterior faced curved surface, also referenced as a circumferential outer lateral surface 34 that forms a curved continuation of first exterior faced contacting surface 40. The first exterior faced contacting surface 40 is deformable in an axial direction when the lid 12 is positioned against a receiving module 60. The outer lateral surface 34 is deformable outwardly from perimeter side wall 26' of lid 12. An interior oriented inner lateral surface 36 is laterally deformable into a void space 26" along the perimeter side wall 26' of the lid 12 when the lid 12 is positioned against a receiving module 60. One or more void areas (not shown) or grooves 42', 42" (see FIGS. 3*b* and 3*c*) may be included in first exterior faced contacting surface 40 or adjacent the inner lateral surface 36 of gasket 30. An alternative shape for the gasket 30, as known to those skilled in the art, may be utilized to provide a deformable gasket 30 that is adapted to be positioned between a first surface 22 of a lid 12 and an opposed surface of a receiving module 60.

Figure 3B:
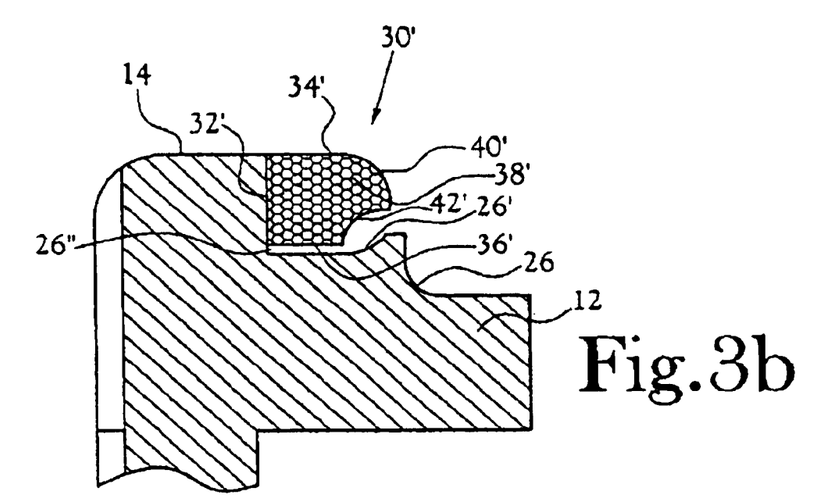
FIG. 3b is an exploded side view, in section taken along 3—3 of FIG. 2, illustrating an alternative embodiment of the gasket positioned on the lid.
Figure 4:
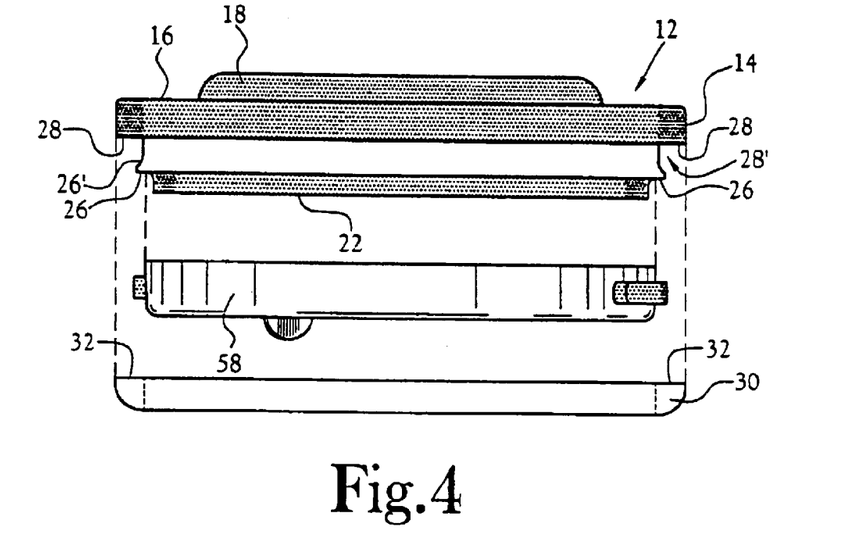
FIG. 4 is a side view of the lid and one embodiment of the gasket before being positioned on the perimeter surface of the lid.

An alternative embodiment illustrated in FIG. 3*b* includes a gasket 30' having a "D" shaped cross-section, with a first bonding surface 32' that is substantially flat for bonding to the first circumferential bonding surface 28 of lid 12 (see FIG. 4). The gasket 30' includes a first, exterior faced contacting surface 40' positioned proximate to a circumferential perimeter surface 26 of the lid 12. The rounded exterior lateral surface 34' of the gasket 30' is deformable when the lid 12 is positioned against a receiving module 60. An inner lateral surface 36' may be rounded or planar, and is laterally deformable into a void space along the circumferential perimeter surface 26 and perimeter side wall 26' of the lid 12. A void or groove 42' is positioned along a portion of the first contacting surface 40'. The groove 42' allows for deformation of the first contacting surface 40' when gasket 30' is positioned with lid 12 against a receiving module 60.

Figure 3C:
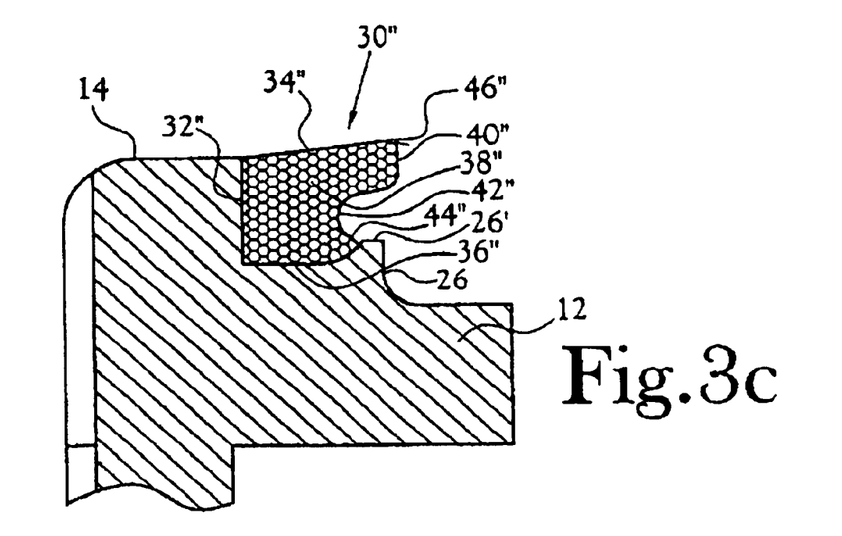
FIG. 3c is an exploded side view, in section taken along 3—3 of FIG. 2, illustrating an additional alternative embodiment of the gasket positioned on the lid.

An additional alternative embodiment illustrated in FIG. 3*c* includes a gasket 30" having a first contacting surface 40" that is deformable to provide axial sealing when contacting surface 40" is positioned against a receiving surface proximal of an interior ledge 66 of the receiving module 60 with the lid 12 is inserted into the receiving module 60. An interior side oriented inner lateral surface 36" is disposed between the first bonding surface 32" and the first contacting surface 40" of the gasket 30". The gasket inner lateral surface 36" provides a second bonding surface for maintaining the gasket inner lateral surface 36" positioned proximate the circumferential perimeter surface 26 having a perimeter side wall 26'. The first contacting surface 40" includes a groove 42" positioned to extend inwardly of the first contacting surface 40". The groove 42" originates proximate to an interior corner 44" of the first contacting surface 40. The first contacting surface 40" further includes an outwardly tapered corner 46" that is laterally deformable during contact against a wall or a portion of the receiving surface of the receiving module 60 when the lid 12 is positioned into an opening 62 of the receiving module 60 (see FIG. 5). Upon positioning of the lid 12 into the receiving module 60, a water resistant connection is maintained between the gasket 30" and the wall of the receiving surface, to provide an enclosure that is substantially moisture-free for storage of electrical components such as electrical circuitry, and/or a power source such as a battery 58. Gasket 30" is readily utilized with a lid 12' and receiving module 60' configured as illustrated in FIG. 6.

Figure 3D:
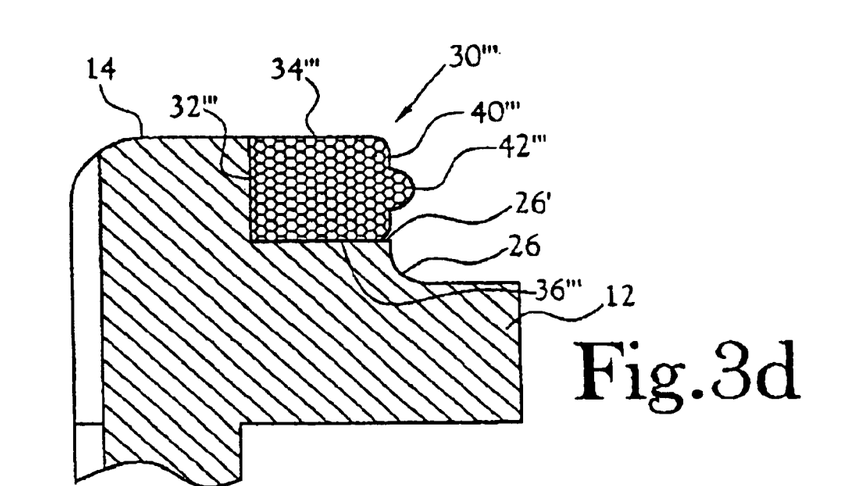
FIG. 3d is an exploded side view, in section taken along 3—3 of FIG. 2, illustrating an additional alternative embodiment of the gasket positioned on the lid.

An additional alternative embodiment illustrated in FIG. 3*d* includes a gasket 30''' having a substantially planar first bonding surface 32''' for bonding the gasket 30''' to the lid 12 (see FIG. 3*d*). An exterior lateral surface 34''' forms an outer surface of the gasket 30'''. An interior oriented inner lateral surface 36''' is disposed between the first bonding surface 32''' and the first contacting surface 40''' of the gasket 30'''. The gasket inner lateral surface 36''' provides a second bonding surface for maintaining the gasket inner lateral surface 36''' positioned proximate the circumferential perimeter surface 26 having a perimeter side wall 26'. The first contacting surface 40''' includes a ridge 42''' is positioned at a central position or at an off-center position along the first contacting surface 40'''. A means for bonding known to those skilled in the art is utilized for bonding each of the gaskets 30, 30', 30", or 30''', to circumferential bonding surface 28 of the lid 12 (see FIG. 4), or for bonding of gasket 30" to interior ledge 66' (see FIG. 6).

For any of the configurations illustrated for the gasket 30 (see FIG. 3*a*), 30' (see FIG. 3*b*), 30" (see FIG. 3*c*), or 30''' (see FIG. 3*d*), the gasket 30 is composed of a resilient material selected from the group including a thermoplastic elastomer (TPE) material, a rubber material or a similar resilient material utilized for sealing gaskets commonly known to those skilled in the art. The TPE material, rubber material, or similar resilient material of the gasket 30 includes an internal lubricant that is integrally blended into the resilient material, and which may gradually be released from the interior 38 of the gasket 30 for diffusion out of the exterior lateral surface 34 and first contacting surface 40 of the gasket 30. The self-lubricating property of the TPE material provides for a resilient gasket 30 when bonded for extended periods of time to the lid 12. Further, the gasket 30 remains substantially resilient to tearing and sticking to the receiving module upon disconnection of the lid from receiving module 60. Prior seals have torn when a lid is removed from a receiving surface due to drying and cracking of prior seals. Also, prior seals have become bonded during use to both surfaces of the lid and the receiving module during contact over extended periods of time and are torn during removal of a lid for replacement of batteries inside the module.

Figure 5:
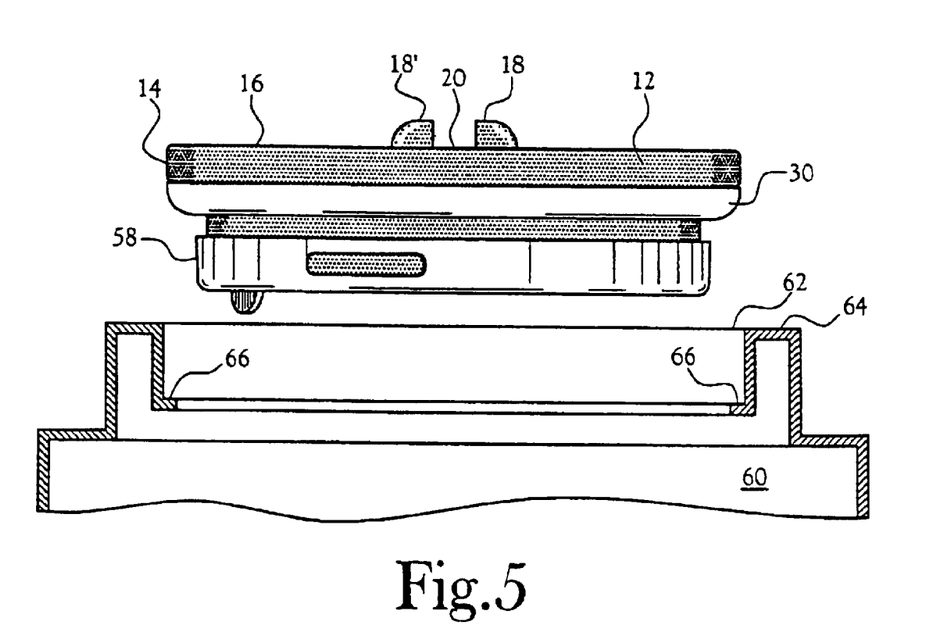
FIG. 5 is a side view of the lid rotated about ninety degrees from the view of FIG. 4, with the gasket disposed on the perimeter surface of the lid.
Figure 6:
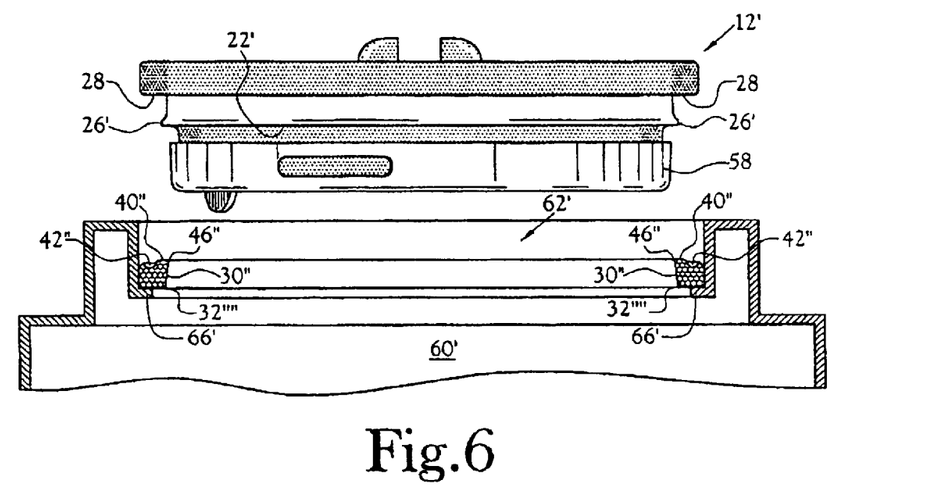
FIG. 6 is a side view illustrating an alternative position for an alternative embodiment of the gasket of the present invention.

As illustrated in FIGS. 4 and 5, the top surface 16 of the lid 12 includes a pair of raised peaks 18, 18' that are spaced apart to provide a groove 20 therebetween for insertion of a screwdriver or tool (not shown) for rotating of the lid 12 for detaching from, and re-attaching into the opening 62 of the receiving module 60.

The opening 62 of receiving module 60 is delineated by a rim having a surface 64 bounding the top portion of the receiving module 60 (see FIG. 5). An interior ledge 66 borders the interior perimeter of the opening 62. When gasket 30" as illustrated in FIG. 3*c* is positioned on a lid 12 that is inserted into opening 62, the outwardly tapered perimeter corner 46" is tapered to be disposed against the interior perimeter of the opening 62 of the receiving module rim surface 64 when the first surface 22 of the lid 12 is inserted into opening 62 formed by the rim surface 64 of receiving module 60.

Those skilled in the art will recognize advantages of the gasket sealing system 10 including an improved moisture resistant seal provided by the internally lubricated gasket 30 positioned between the lid 12 and the receiving module 60. The gasket 30 remains bonded to the lid 12 to allow the gasket 30 to be positioned against an interior ledge 66 of the opening 62 of the receiving module 60, and also allows the gasket 30 to be repetitively disconnected from sealing against the interior surface of the opening and/or against the interior ledge 66 within the opening 62 of the receiving module 60, without disruption of the integrity of the gasket 30. The gasket 30 further provides lubrication from an interior 38 of the gasket 30 that provides reduced friction against respective surfaces of the opening 62 during the locking process of inserting the lid 12 into the opening 62, and during the unlocking process of removing the lid 12 from opening 62.

As illustrated in FIG. 6, an alternative configuration for the gasket of the present invention includes a receiving module 60' having a receiving gasket 30", or a gasket of comparable shape, which is configured to be bonded within the receiving module 60'. The receiving gasket 30" includes a configuration having a cross-section of either a substantially hemispherical shape or a substantially rectangular shape, as illustrated in any one of FIGS. 3a, 3b, 3c, or 3d. One configuration of the receiving gasket 30" includes a groove 42" positioned therein (see FIG. 3c). The gasket 30" utilized as illustrated in FIG. 6 includes a first bonding surface 32"" being bonded to an interior circumferential surface of interior ledge 66' within the opening 62' of the receiving module 60'. If gasket 30" as illustrated in FIG. 3c is utilized, a tapered corner 46" extends outwardly from the first contacting surface 40" and is disposed to form a perimeter seal against an exterior perimeter side wall 26' of the first surface 22' of the lid 12' when the lid 12' is inserted into the opening 62' of the receiving module 60'. The configuration of gasket 30" provides an axial seal due to the deformation of the contacting surface 40" and tapered corner 46", which are pressed against the first surface 22' and perimeter side wall 26' of the lid 12'. Gasket 30" remains bonded at first bonding surface 32"" to interior ledge 66' of receiving module 60', without disruption of the integrity of gasket 30", or a gasket of comparable shape, during repetitive removal and reinsertion of the lid 12' against the receiving module 60'.

An alternative configuration of the gasket 30 (not shown) includes an gasket having a perimeter portion shaped as a square or rectangle that is adapted to match the shape of the surface of a square or a rectangular lid. Additional alternative shaped gaskets having perimeter portions of other shapes may be utilized as known to those skilled in the art to adequately encircle the perimeter surface of any alternative shaped lid.

While a preferred embodiment is shown and described, it will be understood it is not intended to limit the disclosure of the invention, but rather it is intended to cover all modifications and alternate configurations falling within the spirit and scope of the invention as defined in the appended claims.

What is claimed is:

1. A gasket sealing system to provide a moisture barrier seal between a lid and a receiving module sized to contain a battery power source therein, the lid having a perimeter surface defined by a perimeter side wall disposed adjacent to a circumferential ledge of the lid perimeter surface sized to be removably positionable relative to an interior surface and an interior wall bounded by a rim of the receiving module, said gasket sealing system comprising:

a gasket composed of a resilient material and having a plurality of circumferential surfaces, said gasket being disposed on the circumferential ledge of the lid perimeter surface, said gasket including:

a first bonding surface deformable to conform against the circumferential ledge of the lid perimeter surface;

a contacting surface disposed in opposed relationship to said first bonding surface, said contacting surface is deformable axially upon engagement with the interior surface bounded by the rim of the receiving module, said contacting surface includes a groove defined therein, whereby said groove provides for deformation of said contacting surface upon engagement against the interior surface bounded by the rim of the receiving module; and an outer lateral surface in opposed relationship with an inner lateral surface of said gasket, said outer and inner lateral surfaces extend between said first bonding surface and contacting surface of said gasket, said inner lateral surface is disposed in adjacent relationship with the lid perimeter side wall, said outer lateral surface being unrestrained in lateral movement by the circumferential ledge of the lid perimeter surface;

whereby upon initial engagement of said contacting surface against the interior surface of the receiving module, said outer lateral surface is laterally moved for frictionally engagement against the interior wall of the receiving module thereby providing said moisture barrier seal of the gasket between the lid and the receiving module;

whereby upon removal of the lid perimeter surface from engagement with the interior surface bounded by the rim of the receiving module, said contacting surface of said gasket is disengaged from the receiving module without disruption of said gasket.

2. The gasket sealing system of claim 1, wherein said contacting surface includes a perimeter corner proximal to said groove, said perimeter corner is disposed to sealingly engage the surface bounded by the rim of the receiving module.

3. A sealing system providing a moisture barrier seal between a lid and a receiving module, comprising:

an outer circumferential ledge in the lid defined by an exterior perimeter side wall which intersects with a first bonding surface and extends to intersect substantially perpendicular with a circumferential perimeter ledge;

a gasket composed of a resilient material carried on said outer circumferential ledge of the lid and adapted to be in a substantially relaxed state when the lid is not engaged with the receiving module, said gasket attains a compressed state when the lid is disposed in at least partial sealing relationship to the receiving module, said gasket including:

an outer lateral surface portion unbounded by said outer circumferential ledge in the lid, said outer lateral surface portion exposed to engage the receiving module when the lid is applied to the receiving module, said outer lateral surface portion of said gasket being constrained against substantial radially outward circumferential movement when the lid is engaged with the receiving module to thereby define a first seal engagement between said gasket carried on the lid and the receiving module;

an inner lateral surface portion of said gasket disposed contiguous to said exterior perimeter side wall of said outer circumferential ledge in the lid when said gasket is relaxed, said inner lateral surface portion of said gasket is spaced apart from said exterior perimeter side wall of said outer circumferential ledge in the lid and defining an annular open space therebetween when said gasket in its substantially relaxed state, whereby said gasket frictionally engages said exterior perimeter side wall of said outer circumferential ledge in the lid when said gasket is in a substantially compressed state to define a first gasket seal between said inner lateral surface portion of said gasket and said outer circumferential ledge in the lid;

a bonding surface portion of said gasket disposed between said outer lateral surface and inner lateral surface portions of said gasket, said bonding surface portion overlying and frictionally engaging said circumferential ledge of the lid and disposed to define a second gasket seal between said gasket and the outer circumferential ledge in the lid; and a contacting surface portion of said gasket disposed between said outer lateral surface and inner lateral surface portions of said gasket and opposite said bonding surface portion of said gasket, said contacting surface portion of said gasket being unbounded by the outer circumferential ledge in the lid and exposed to engage the receiving module when the lid is applied to the receiving module, whereby application of the lid to the receiving module functions to compress said gasket to said compressed state and further defines a second seal engagement between said gasket carried on the lid and the receiving module;

whereby disengagement of the lid from the receiving module reduces the frictional engagement of said inner lateral surface portion of said gasket against said exterior perimeter side wall of said outer circumferential ledge without material movement of said bonding surface portion of said gasket against said circumferential ledge of the lid.

4. The sealing system of claim 3, wherein said contacting surface portion of said gasket includes an arcuate configuration which is axially deformable to sealingly engage the receiving module, said contacting surface is compressed upon engagement of said gasket in said compressed state between the lid and the receiving module, whereby said inner lateral surface portion of said gasket is laterally deformed and frictionally engages said outer circumferential ledge and said outer lateral surface portion is radially constrained by contact with the receiving module.

5. The sealing system of claim 4, wherein said contacting surface of said portion of said gasket further includes a perimeter corner disposed adjacent said contacting surface portion, said perimeter corner being configured to laterally deform to engage against the receiving module, whereby said perimeter corner maintains said first seal against the receiving module when the lid is partially disengaged from engagement with the receiving module thereby maintaining the moisture barrier seal between the lid and the receiving module until the lid is removed from engagement with the receiving module.

6. The sealing system of claim 5, wherein said gasket is of an annular configuration, said gasket further including said contacting surface of said contacting surface having an outer corner forming a deformable junction with said outer lateral surface portion, said outer corner being tapered to extend outwardly from said deformable junction whereby said outer corner and said outer lateral surface portion frictionally engage the receiving module upon insertion of the lid into the receiving module.

7. The sealing system of claim 6 wherein said resilient material is selected from the group consisting essentially of a thermoplastic elastomer material, a rubber material, and a sufficiently resilient material.

8. The sealing system of claim 7, wherein said gasket includes an interior composed of a resilient material having an internal lubricant that is integrally blended into said resilient material, whereby said internal lubricant is gradually released from said interior of said gasket over time in the course of use of said gasket between an engaged and compressed state, and an disengaged and substantially relaxed state.

* * * * *

UNITED STATES PATENT AND TRADEMARK OFFICE
CERTIFICATE OF CORRECTION

| | | |
|---|---|---|
| PATENT NO. | : 6,921,089 B2 | Page 1 of 1 |
| APPLICATION NO. | : 10/704004 | |
| DATED | : July 26, 2005 | |
| INVENTOR(S) | : William S. Groh et al. | |

It is certified that error appears in the above-identified patent and that said Letters Patent is hereby corrected as shown below:

Title page, item [73] Assignee: should read as follows: Radio System Corporation, Knoxville, TN Signed and Sealed this
Twenty-fifth Day of January, 2011

David J. Kappos
*Director of the United States Patent and Trademark Office*